United States Patent [19]

Tanigawa

[11] Patent Number: 5,740,099

[45] Date of Patent: Apr. 14, 1998

[54] SEMICONDUCTOR MEMORY DEVICE HAVING PERIPHERAL CIRCUIT AND INTERFACE CIRCUIT FABRICATED ON BULK REGION OUT OF SILICON-ON-INSULATOR REGION FOR MEMORY CELLS

[75] Inventor: Takaho Tanigawa, Tokyo, Japan

[73] Assignee: NEC Corporation, Tokyo, Japan

[21] Appl. No.: 596,567

[22] Filed: Feb. 5, 1996

[30] Foreign Application Priority Data

Feb. 7, 1995 [JP] Japan .................................. 7-019555

[51] Int. Cl.[6] .............................................. G11C 11/24
[52] U.S. Cl. ........................ 365/51; 365/63; 257/350; 257/351; 257/353; 257/354
[58] Field of Search ...................................... 365/149, 154, 365/63, 51; 257/350, 351, 353, 354

[56] References Cited

U.S. PATENT DOCUMENTS

| | | | |
|---|---|---|---|
| 5,371,401 | 12/1994 | Kozaburo | 257/350 |
| 5,495,437 | 2/1996 | Morihara | 257/350 |

FOREIGN PATENT DOCUMENTS

| | | |
|---|---|---|
| 2-218159 | 8/1990 | Japan . |
| 06 334 147 | 12/1994 | Japan . |

OTHER PUBLICATIONS

"An SOI-DRAM with Wide Operating Voltage Range by CMOS/SIMOX Technology" by 1994 IEEE International Solid-State Circuits Conference pp. 138-139, 324 vol. 37.

Patent Abstracts of Japan, vol. 017, No. 264 (E-1370), 24 May 1993 Takeshi JP 5006979.

*Primary Examiner*—Vu A. Le
*Attorney, Agent, or Firm*—Laff, Whitesel, Conte & Saret, Ltd.

[57] ABSTRACT

A semiconductor dynamic random access memory device has a memory cell array fabricated on a silicon-on-insulator region and peripheral and interface circuits fabricated on a bulk region; even if the circuit components of the peripheral circuit are increased together with the memory cells, the bulk region effectively radiates the heat generated by the peripheral and interface circuits, thereby preventing the memory cells from a temperature rise.

8 Claims, 14 Drawing Sheets

PRIOR APT

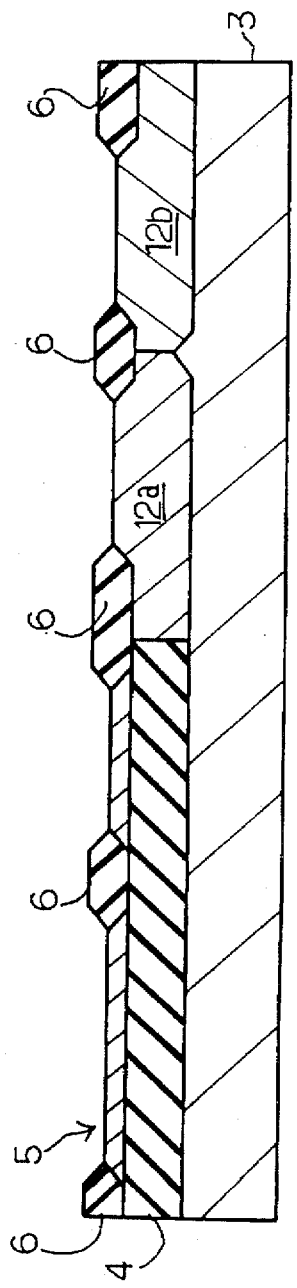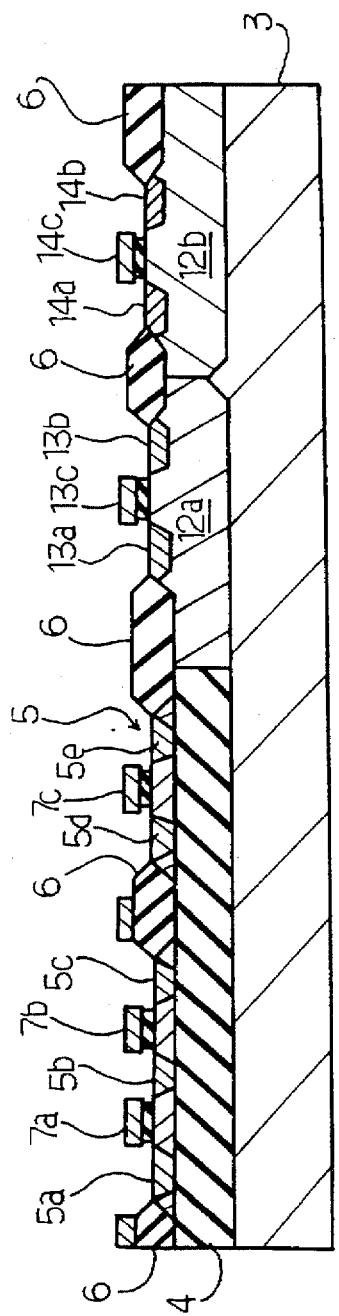

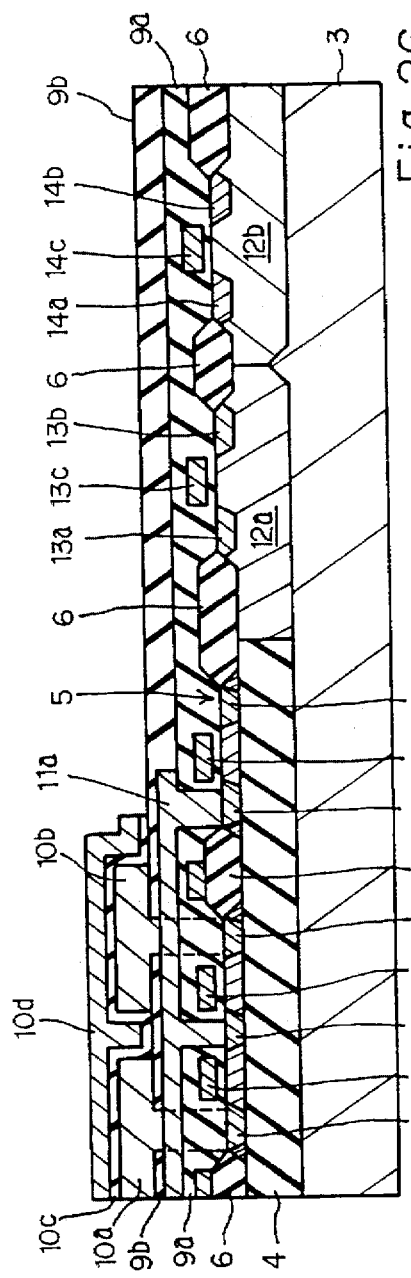
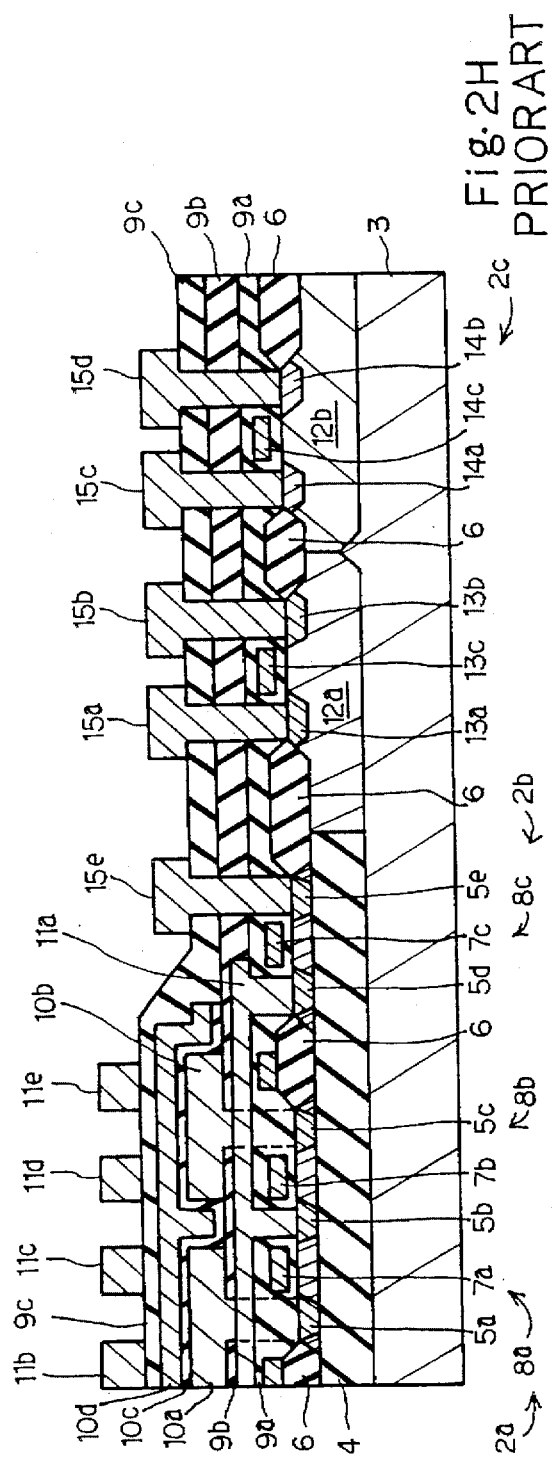

SEMICONDUCTOR MEMORY DEVICE HAVING PERIPHERAL CIRCUIT AND INTERFACE CIRCUIT FABRICATED ON BULK REGION OUT OF SILICON-ON-INSULATOR REGION FOR MEMORY CELLS

FIELD OF THE INVENTION

This invention relates to a semiconductor memory device and, more particularly, to a semiconductor memory device having memory cells fabricated on a silicon-on-insulator region and logic circuits and an input-and-output circuit fabricated on a bulk region.

DESCRIPTION OF THE RELATED ART

A silicon-on-insulator structure is the structure where a buried insulating layer electrically isolates a silicon layer from a silicon substrate. The silicon-on-insulator structure does not always occupy the entire surface of a silicon substrate, but is sometimes formed on a part of the silicon substrate. Such a selective silicon-on-insulator substrate is disclosed in Japanese Patent Publication of Unexamined Application No. 2-218159, and an integrated circuit is fabricated partially on the silicon-on-insulator structure and partially on the silicon substrate. The area assigned to the silicon-on-insulator structure is hereinbelow referred to as "silicon-on-insulator region", and the other area outside the silicon-on-insulator structure is hereinbelow called as "bulk region".

FIG. 1 illustrates a dynamic random access memory device fabricated on the prior art selective silicon-on-insulator substrate 1, and the selective silicon-on-insulator substrate 1 is divided into the silicon-on-insulator region 1a and the bulk region 1b. The silicon-on-insulator region 1a is assigned to a memory cell array 2a and logic circuits 2b, and the bulk region 1b is assigned to an input-and-output circuit 2c. In detail, the prior art dynamic random access memory device is fabricated on a p-type silicon substrate 3, and a buried oxide layer 4 is grown on a part of the p-type silicon substrate 3 assigned to the SOI region 1a. A silicon layer 5 is deposited on the buried oxide layer 4, and a thick field oxide layer 6 is selectively grown in the silicon layer 5.

Heavily doped n-type regions 5a, 5b and 5c and other heavily doped n-type regions 5d and 5e are formed in the silicon layer 5. Gate structure 7a and 7b are formed over the silicon layer 5 between the heavily doped n-type regions 5a and 5b and between the heavily doped n-type regions 5b and 5c, and a gate structure 7c is formed over the silicon layer 5 between the other heavily doped n-type regions 5d and 5e. The heavily doped n-type regions 5a/5b and the gate structure 7a and the heavily doped n-type regions 5b and 5c and the gate structure 7b form n-channel enhancement type switching transistors of dynamic random access memory cells 8a and 8b. On the other hand, the heavily doped n-type regions 5d and 5e and the gate structure 7c form in combination an n-channel enhancement type field effect transistor 8c, and the n-channel enhancement type field effect transistor 8c forms a part of the logic circuits.

The gate structures 7a to 7c are covered with first and second inter-level insulating layers 9a and 9b, and accumulating electrodes 10a/10b on the second inter-level insulating layer 9b, a dielectric film 10c and a counter electrode 10d form stacked type storage capacitors of the dynamic random access memory cells 8a and 8b. The accumulating electrodes 10a and 10b are held through contact holes formed in the first and second inter-level insulating layers 9a and 9b to the heavily doped n-type regions 5a and 5c, and the heavily doped n-type impurity region 5b is connected through a bit line 11a on the first inter-level insulating layer 9a to the heavily doped n-type region 5d of the n-channel enhancement type field effect transistor 8c of the logic circuits. The counter electrode 10d is covered with a third inter-level insulating layer 9c, and wiring strips 11b, 11c, 11d and 11e extend on the third inter-level insulating layer 9c.

On the other hand, a p-type well 12a and an n-type well 12b are formed in the bulk region 1b, and heavily doped n-type regions 13a/13b and heavily doped p-type regions 14a/14b are formed in the p-type well 12a and the n-type well 12b, respectively. Gate structures 13c and 14c are formed over the p-type well 12a between the heavily doped n-type impurity regions 13a and 13b and over the n-type well between the heavily doped p-type impurity regions 14a and 14b, respectively. The first and second inter-level insulating layers 9a and 9b and the third-inter-level insulating layer 9c are laminated on the bulk region 1b and the gate structures 13c and 14c, and interconnections 15a/15b and interconnections 15c and 15d are held in contact with the heavily doped n-type regions 13a/13b and the heavily doped p-type regions 14a/14b through contact holes formed in the first to third inter-level insulating layers 9a to 9c. An interconnection 15e passes through a contact hole formed in the first to third inter-level insulating layers 9a to 9c, and is held in contact with the heavily doped n-type region 5e. The heavily doped n-type regions 13a/13b and the gate structure 13c form in combination an n-channel enhancement type field effect transistor, and the heavily doped p-type regions 14a/14b and the gate structure 14c as a whole constitute a p-channel enhancement type field effect transistor. The interconnections 15a to 15d fabricate the input-and-output circuit 2c from the n-channel enhancement type field effect transistor, the p-channel enhancement type field effect transistor and other field effect transistors.

The input-and-output circuit 2c consumes a large amount of current, and, accordingly, generates a large amount of heat. The bulk region 1b effectively radiates the heat.

On the other hand, the dynamic random access memory cells 8a/8b and the logic circuits 2b are expected to operate at high speed without a malfunction. The buried oxide layer 4 electrically isolates the silicon-on-insulator region 1a from the p-type silicon substrate 3, and the field effect transistors of the memory cells 8a/8b and the field effect transistor 8c of the logic gates 2b are perfectly separated from one another by means of the buried oxide layer 4 and the thick field oxide layer 6. For this reason, parasitic capacitance is decreased, and electric signals are propagated at high speed. The logic circuits and the memory cells 8a/8b are free from a latch-up phenomenon and a soft error due to alpha-particles, and junction leakage current is decreased. Thus, the selective silicon-on-insulator substrate is desirable for the semiconductor dynamic random access memory device.

The prior art semiconductor dynamic random access memory device is fabricated through the process sequence shown in FIGS. 2A to 2H. The process starts with preparation of the p-type silicon substrate 3. A silicon oxide layer 20 is grown on the major surface of the p-type silicon substrate 3, and a photo-resist mask 21 covers a part of the silicon oxide layer 20 over the area assigned to the bulk region 1b. Oxygen is ion implanted into the exposed area of the p-type silicon substrate 3 at dose of $1\times10^{17}$ to $2\times10^{18}$ $cm^{-2}$ under acceleration energy of 200 KeV as shown in FIG. 2A.

The photo-resist mask 21 is stripped off, and the p-type silicon substrate 3 is heated to 1300 degrees in centigrade for 6 hours. While the p-type silicon substrate 3 is being heated, the implanted oxygen reacts with the single crystal silicon, and forms the buried oxide layer 4. The thickness of the silicon layer 5 is dependent on the amount of implanted oxygen. If the dose is $10^{18}$ cm$^{-2}$, the silicon layer 5 is 150 nanometers thick.

A photo-resist mask 22 is patterned on the silicon oxide layer 20 over an area assigned to the n-type well 12b, and boron is ion implanted into the exposed p-type silicon substrate 3 at dose of 1–2×10$^{13}$ cm$^{-2}$ under acceleration energy of 70 KeV as shown in FIG. 2B.

The photo-resist mask 22 is stripped off, and a photo-resist mask 23 is formed over an area assigned to the silicon-on-insulator region 1a and the p-type well 12a, and phosphorous is ion implanted into the exposed area of the p-type silicon substrate 3 at dose of 1–2×10$^{13}$ cm$^{-2}$ under acceleration energy of 150 KeV as shown in FIG. 2C.

The photo-resist mask 23 is stripped off, and the p-type silicon substrate 3 is annealed in gaseous mixture of nitrogen and oxygen at 1200 degrees in centigrade for an hour. The ion-implanted boron and the ion-implanted phosphorous are diffused in the p-type silicon substrate 3, and form the silicon layer 5, the p-type well 12a contiguous to the silicon layer 5 and the n-type well 12b adjacent to the p-type well 12a as shown in FIG. 2D.

Subsequently, the thick field oxide layer 6 is selectively grown on the silicon layer 5, the p-type well 12a and the n-type well 12b by using the LOCOS (Local Oxidation of Silicon) process. The thick field oxide layer 6 defines active areas assigned to the memory cells 8a/8b, the n-channel enhancement type field effect transistor 8c, the n-channel enhancement type field effect transistor and the p-channel enhancement type field effect transistor. The resultant structure of this stage is illustrated in FIG. 2E.

A silicon oxide layer is thermally grown on the silicon layer 5, the p-type well 12a and the n-type well 12b, and a polysilicon layer is deposited on the entire surface of the structure. An appropriate photo-resist mask is patterned on the polysilicon layer, and the polysilicon layer is patterned into gate electrodes. The gate electrodes and the gate oxide layers therebeneath form the gate structures 7a to 7c, 13c and 14c.

An appropriate photo-resist mask is provided over the n-type well 12b, and n-type dopant impurity is ion implanted into the silicon layer 5 and the p-type well 12a. As a result, the heavily doped n-type regions 5a to 5e, 13a and 13b are formed in the silicon layer 5 and the p-type well 12a in a self-aligned manner with the gate structure 7a to 7c and 13c. The photo-resist mask is stripped off, and a new photo-resist mask is patterned in such a manner as to cover the silicon layer 5 and the p-type well 12a. P-type dopant impurity is ion implanted into the n-type well, and the heavily doped p-type regions 14a and 14b are formed in the n-type well 12b in a self-aligned manner with the gate structure 14c. The resultant structure of this stage is illustrated in FIG. 2F.

Subsequently, silicon oxide is deposited on the entire surface of the structure by using a chemical vapor deposition, and a phospho-silicate-glass layer or a boro-phospho-silicate-glass layer is laminated on the silicon oxide layer. These layers form in combination the first inter-level insulating layer 9a.

Contact holes are formed in the first inter-level insulating layer 9a, and expose the heavily doped n-type regions 5b and 5d. A tungsten silicide layer is deposited over the first inter-level insulating layer 9a, and is held in contact through the contact holes with the heavily doped n-type regions 5b and 5d. The tungsten silicide layer is patterned though a lithographic process, and the bit line 11a is left on the first inter-level insulating layer 9a.

Subsequently, the bit line 11a and the first inter-level insulating layer 9a are covered with the second inter-level insulating layer 9b, and contact holes are formed through the first and second inter-level insulating layers 9a and 9b. The contact holes expose the heavily doped n-type regions 5a and 5c, respectively.

Polysilicon is deposited on the second inter-level insulating layer 9b, and the polysilicon layer is held through the contact holes with the heavily doped n-type regions 5a and 5c. An appropriate photo-resist mask is provided on the polysilicon layer, and the polysilicon layer is patterned into the accumulating electrodes 10a and 10b. Silicon nitride is deposited over the entire surface of the structure, and is partially oxidized so as to laminate a silicon oxide layer on the silicon nitride layer. Polysilicon is deposited on the silicon oxide layer, and the polysilicon layer, the silicon oxide layer and the silicon nitride layer are patterned into the dielectric film 10c and the counter electrode 10d as shown in FIG. 2G.

The third inter-level insulating layer 9c is deposited over the entire surface of the structure, and is formed of silicon oxide, phospho-silicate glass or boro-phospho-silicate glass. Contact holes are formed through the first to third inter-level insulating layers 9a to 9c, and aluminum is sputtered on the third inter-level insulating layer 9c. The aluminum layer is patterned into the wirings 11b to 11e and the interconnections 15a to 15e by using the lithographic process as shown in FIG. 2H. FIG. 2H is corresponding to FIG. 1. The memory cells 8a and 8b and the logic circuits 2b are fabricated on the silicon-on-insulator region 1a, and the input-and-output circuit 2c is formed on the bulk region 1b.

The memory cell array 2a, the logic circuits 2b and the input-and-output circuit 2c of a standard dynamic random access memory device occupy 50 percent, 40 percent and 10 percent of the real estate on the semiconductor substrate 3. The dynamic random access memory device has progressively increased the memory cells, and research and development efforts are still made on a semiconductor dynamic random access memory device with a larger memory capacity. Therefore, the occupation area assigned to the memory cell array 2a and the associated logic circuits 2b is further increased; however, the occupation area for the input-and-output circuit 2c is substantially constant. In this situation, the memory cell array 2a and the logic circuits 2b generate a larger amount of heat, and the silicon-on-insulator structure can not sufficiently radiate the heat. As a result, the heat generated by the memory cell array 2a and the logic circuits 2b raises the temperature of the semiconductor substrate 3, and deteriorates the data holding characteristics of the memory cells 8a and 8b. This is the first problem inherent in the prior art semiconductor dynamic random access memory device shown in FIG. 1.

The silicon-on-insulator structure improves the sub-threshold and restricts the short-channel effect, and these advantages becomes clear when the silicon layer 5 is decreased to 100 nanometers thick or less. However, if the heavily doped n-type impurity regions 5d and 5e are formed in such a thin silicon layer 5, large parasitic capacitance is coupled to the heavily doped n-type regions 5d and 5e, and the large parasitic capacitance retards the signal propagation from or to the logic circuits 2b. A read-out/write-in data bit is propagated through the bit line 11a, and is less affected by the large parasitic capacitance. The logic circuits 2b are usually expected to complete the task at high speed, and the large parasitic capacitance has strong influence on the function of the logic circuits 2b.

Although a titanium salicide structure or a lifted structure achieved by a selective tungsten growth is effective against the large parasitic capacitance coupled to the heavily doped n-type regions 5d and 5e, the titanium and the tungsten hate a heat treatment over 750 degrees in centigrade. However, the storage capacitors require a heat treatment around 800 degrees in centigrade, and the titanium salicide structure and the lifted structure are less employable in the fabrication process for the semiconductor dynamic random access memory device. Moreover, the titanium and tungsten are so expensive that the production cost of the semiconductor dynamic random access memory device is increased. Thus, the prior art semiconductor dynamic random access memory device encounters the second problem in the large parasitic capacitance due to the thin silicon layer 5 in the silicon-on-insulator region 1a.

SUMMARY OF THE INVENTION

It is therefore an important object of the present invention to provide a semiconductor memory device which is free from the first and second problems inherent in the prior art dynamic random access memory device.

To accomplish the object, the present invention proposes to selectively assign logic circuits to a silicon-on-insulator region and a bulk region.

In accordance with the present invention, there is provided a semiconductor memory device fabricated on a semiconductor substrate including a bulk region and a semiconductor-on-insulator region having an insulating layer isolating a first semiconductor layer from a second semiconductor layer, comprising: a memory cell array fabricated on the first semiconductor layer in the semiconductor-on-insulator region for storing pieces of data information; an interface circuit fabricated on the bulk region for transferring the pieces of data information to an external device; and a peripheral circuit coupled between the memory cell array and the interface circuit for selectively transferring the pieces of data information therebetween and having first logic circuits fabricated on the bulk region.

BRIEF DESCRIPTION OF THE DRAWINGS

The features and advantages of the semiconductor memory device according to the present invention will be more clearly understood from the following description taken in conjunction with the accompanying drawings in which:

FIGS. 2A to 2H are cross sectional views showing the process sequence for fabricating the prior art semiconductor dynamic random access memory device;

DESCRIPTION OF THE PREFERRED EMBODIMENTS

First Embodiment

Figure 1:
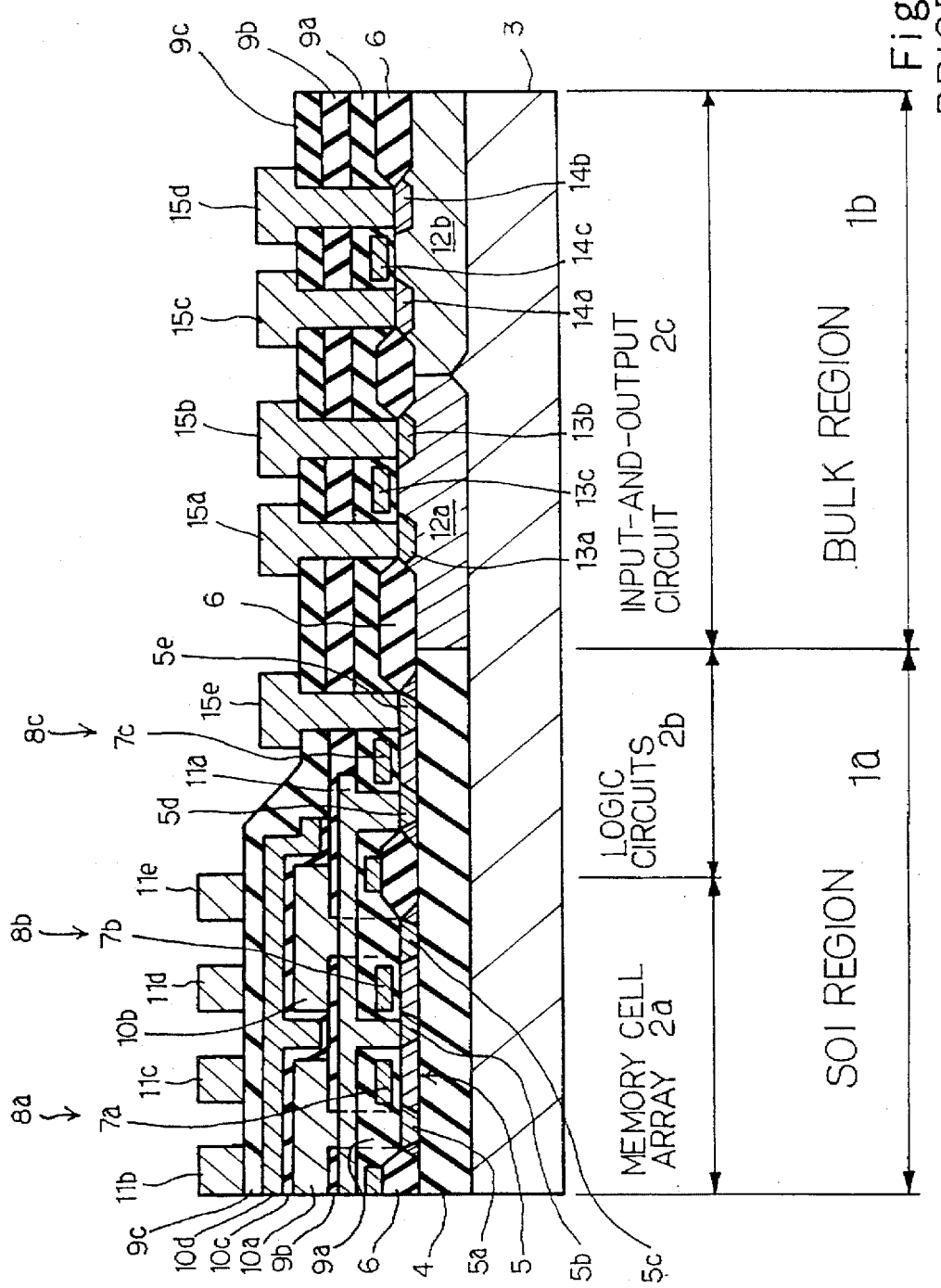
FIG. 1 is a cross sectional view showing the structure of the prior art semiconductor dynamic random access memory device.
Figure 2A:
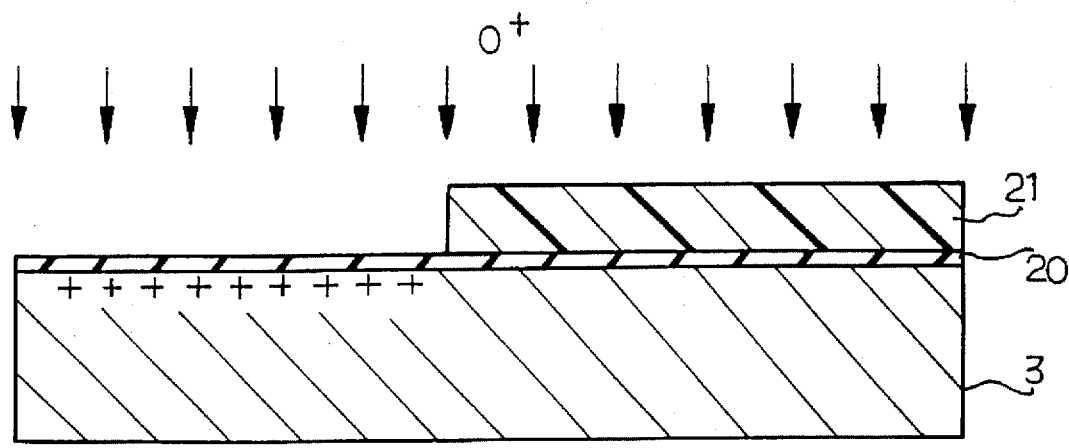
Figure 2B:
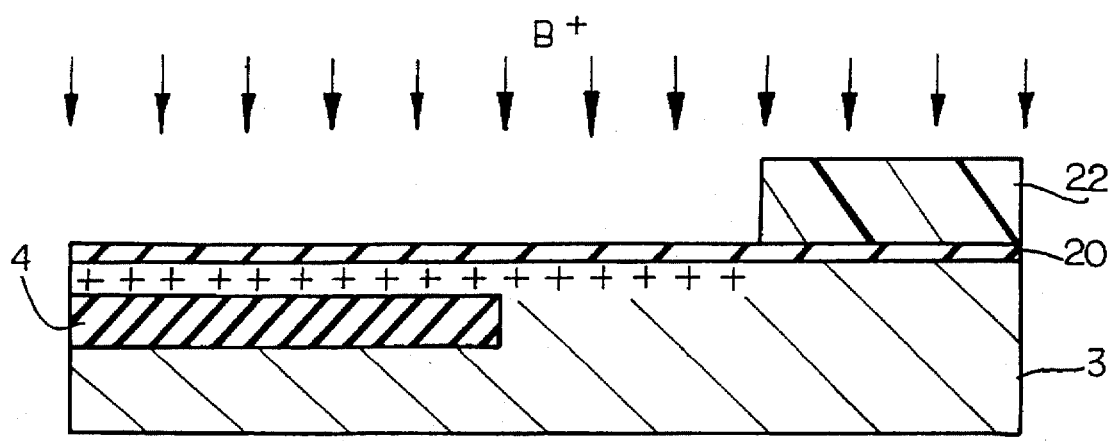
Figure 2C:
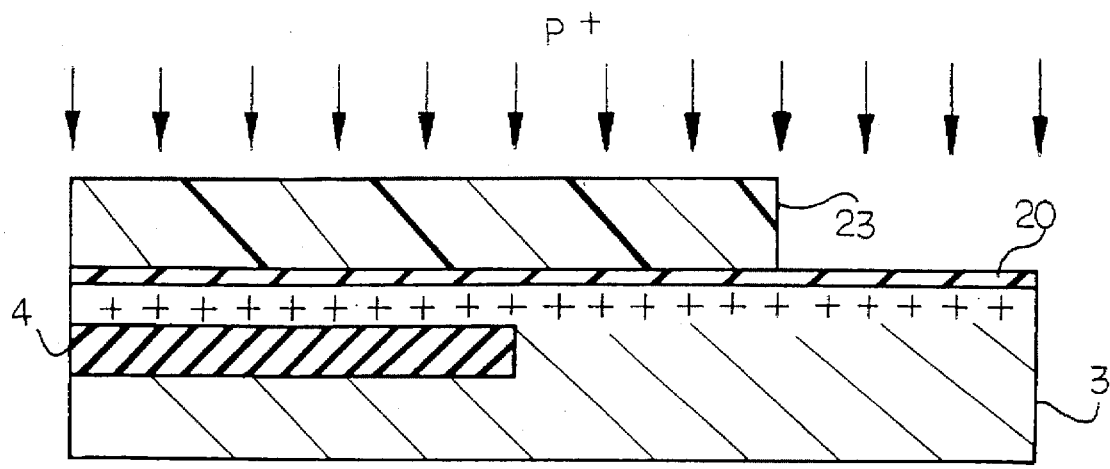
Figure 2D:
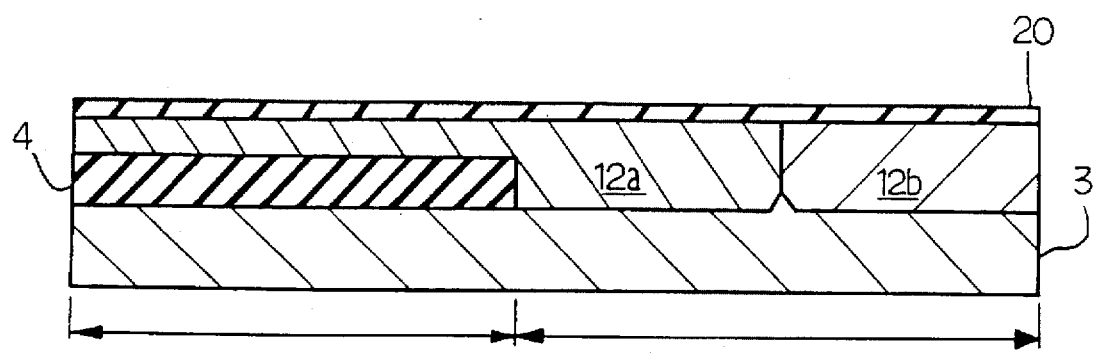
Figure 3:
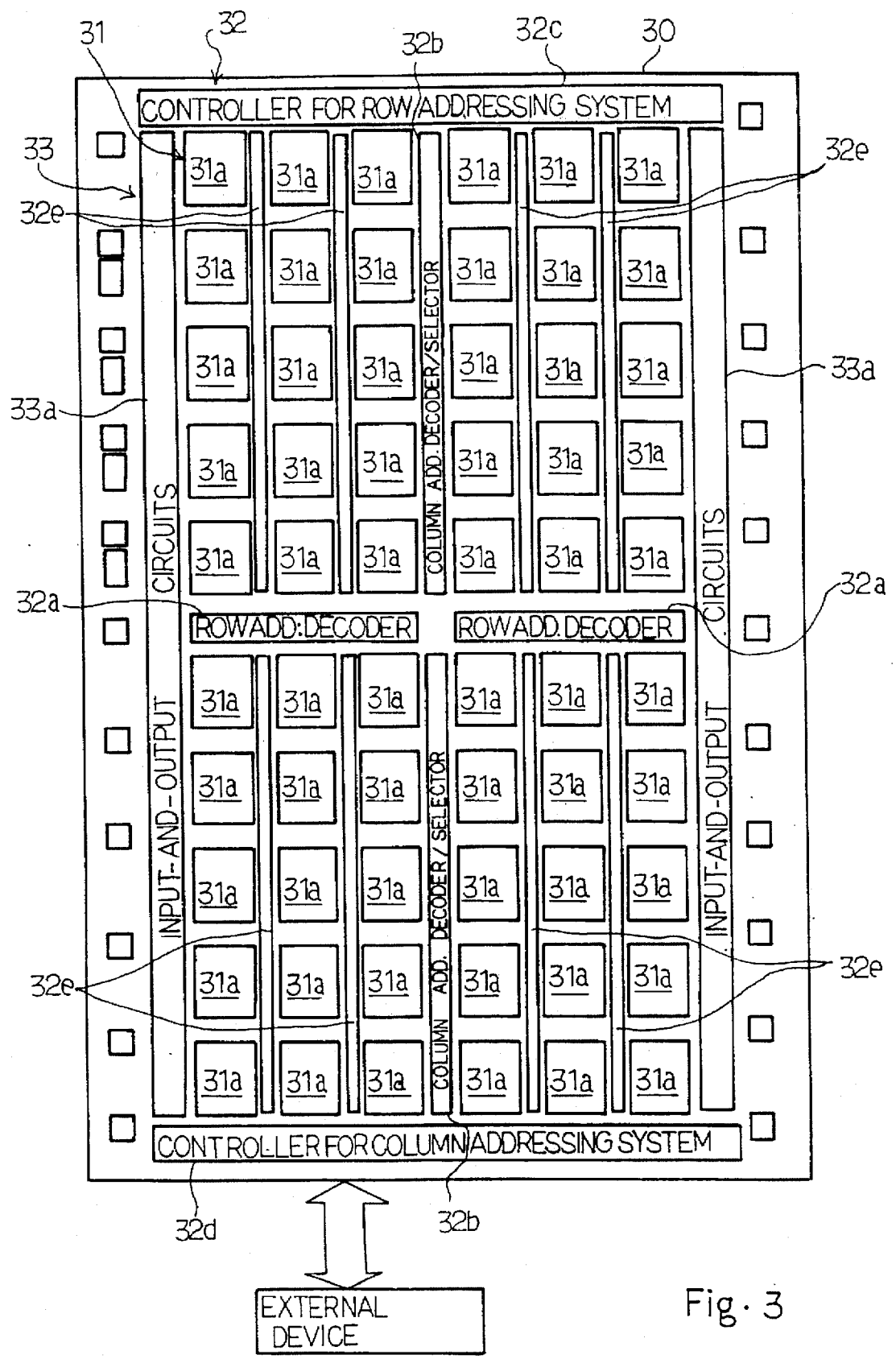
FIG. 3 is a plan view showing the layout of component elements of a semiconductor dynamic random access memory device according to the present invention.
Figure 4:
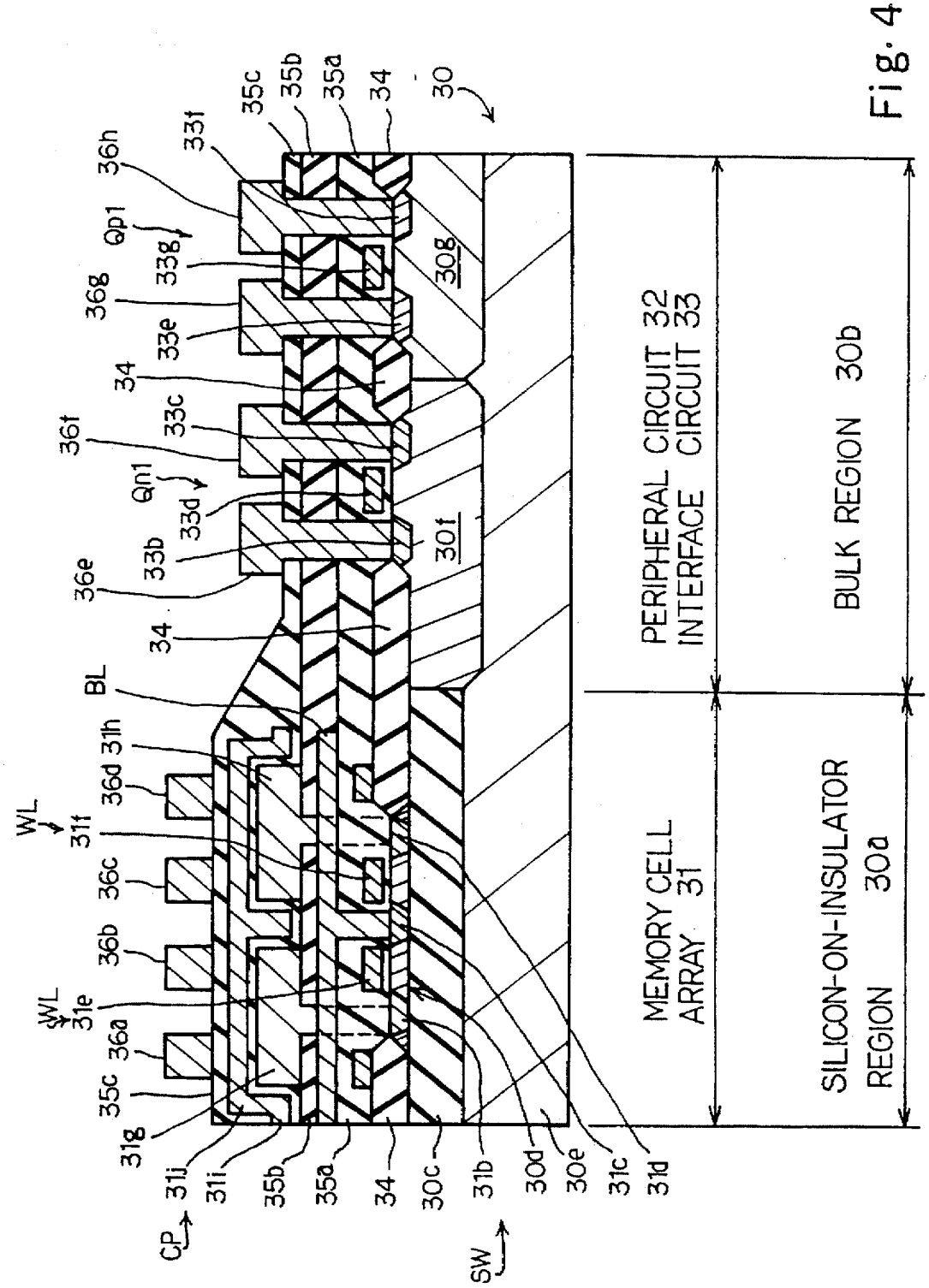
FIG. 4 is a cross sectional view showing the structure of the semiconductor dynamic random access memory device according to the present invention.

Referring to FIGS. 3 and 4 of the drawings, a semiconductor dynamic random access memory device is fabricated on a semiconductor substrate 30, and largely comprises a memory cell array 31, a peripheral circuit 32 and an interface circuit 33.

The semiconductor substrate 30 includes a silicon-on-insulator region 30a and a bulk region 30b. A buried silicon oxide layer 30c is selectively formed in the semiconductor substrate 30, and separates a p-type surface layer 30d from a p-type bottom layer 30e. The p-type surface layer 30d over the buried silicon oxide layer 30c serves as the silicon-on-insulator region 30a or a semiconductor-on-insulator region. In this instance, the p-type surface layer 30d ranges 10 nanometers to 100 nanometers thick. For this reason, the p-type surface layer 30d improves the sub-threshold characteristics, and is effective against the short-channel effect.

The bulk region 30b is out of the silicon-on-insulator region 30a, and p-type wells 30f and n-type wells 30g are formed in the bulk region 30b. A thick field oxide layer 34 is selectively grown in the p-type surface layer 30d, the p-type wells 30f and the n-type wells 30g, and defines active areas assigned to the memory cells and circuit components of the peripheral/interface circuits 32/33.

A plurality of memory cell sub-arrays 31a are arranged in rows and columns, and form the memory cell array 31. Each of the memory cell sub-arrays 31a includes memory cells arranged in matrix, and each of the memory cells is implemented by a series of n-channel enhancement type switching transistor SW and a stacked type storage capacitor CP. A data bit is stored in the storage capacitor in the form of electric charge, and an external device accesses the data information stored in the memory cell array 31.

All of the memory cells are fabricated on the silicon-on-insulator region 30a. In detail, n-type dopant impurity is selectively introduced into the p-type surface layer 30d, and forms heavily doped n-type regions 31b, 31c and 31d in the p-type surface layer 30d. Gate electrodes 31e and 31f are formed over the p-type surface layer 30d between the heavily doped n-type regions 31b and 31c and between the heavily doped n-type regions 31c and 31d, and form parts of word lines WL. The gate electrodes 31e and 31f and the heavily doped n-type regions 31b to 31d as a whole constitute the n-channel enhancement type switching transistors SW of two memory cells.

The n-channel enhancement type switching transistors SW are overlain by a first inter-level insulating layer 35a. A bit lines BL extends on the first inter-level insulating layer 35a, and is held in contact through a contact hole formed in the first inter-level insulating layer 35a with the heavily doped n-type region 31c.

The bit line BL is overlain by a second inter-level insulating layer 35b, and accumulating electrodes 31g and 31h are formed on the second inter-level insulating layer 35b. The accumulating electrodes 31g and 31h are held in contact through contact holes formed in the first and second inter-level insulating layers 35a/35b with the heavily doped n-type regions 31b/31d, and are covered with a dielectric film structure 31i. A counter electrode 31j extends on the dielectric film structure 31i, and the accumulating electrodes 31g/31h, the dielectric film structure 31i and the counter electrode 31j as a whole constitute the stacked type storage capacitors CP.

The counter electrode 31j is covered with a third inter-level insulating layer 35c, and wirings 36a to 36d are formed on the third-inter-level insulating layer 35c.

Although FIG. 4 illustrates only two memory cells, all of the memory cells are fabricated on the silicon-on-insulator region 30a, and have the same structure as those shown in FIG. 4.

The peripheral circuit 32 makes the external device selectively access the data bits. Namely, the peripheral circuit 32 includes row address decoder units 32a coupled through the word lines WL to the memory cell array 31, column address decoder/selector units 32b coupled through the bit lines BL to the memory cell array 31, a controller for the row addressing system 32c and a controller for the column addressing system 32d, and these units 32a to 32d selects a memory cell or memory cells from the memory cell array 31 on the basis of external address signals.

The peripheral circuit 32 further includes sense amplifier units 32e coupled to the bit lines, and the sense amplifier units 32e increases potential differences representative of the data bits. The data bits are transferred through the sense amplifier units 32e between the selected memory cells and the interface circuit 33, and, for this reason, the peripheral circuit 32 selectively transfers the data bit or bits between the memory cell array 31 and the interface circuit 33. In this instance, the peripheral circuit 32 are fabricated on the bulk region 30b.

The circuit components of the peripheral circuit 32 are increased together with the memory cells, and generate large amount of heat. However, the bulk region 30b effectively radiates the heat, and does not allow the temperature in the silicon-on-insulating region 30a to rise. For this reason, the data holding characteristics of the memory cell array 31 are never deteriorated. Moreover, an insulating layer does not extend beneath the impurity regions of the component transistors of the peripheral circuit 32, and the parasitic capacitance coupled to the impurity regions is relatively small. For this reason, the peripheral circuit 32 switches signals at high speed.

The interface circuit 33 includes input-and-output circuits 33a. The input-and-output circuits 33a receive the external address signals, and supply address predecoded signals to the row address decoder units 32a and the column address decoder/selector units 32b. Thus, the input-and-output circuits 33a allows the row address decoder units 32a and the column address decoder/selector units 32b to select a memory cell or memory cells from the memory cell array 31a.

The input-and-output circuits 33a further receive an input data signal from the external device, and supplies a data bit or data bits through the column address decoder/selector units 32b and the bit lines BL to the selected memory cell or cells. The input-and-output circuits 33a further receive the data bit or bits from the selected memory cell or cells through the bit lines BL, and supply an output data signal to the external device. Thus, the input-and-output circuits 33a transfers the data bit or the data bits between the external device and the peripheral circuit 32.

The input-and-output circuits 33 are expected to drive large capacitive load, and large transistors are incorporated in the input-and-output circuits 33 so as to drive the large capacitive load. FIG. 4 illustrates an n-channel enhancement type field effect transistor Qn1 and a p-channel enhancement type field effect transistor Qp1 forming parts of the input-and-output circuit 33a. Heavily doped n-type regions 33b and 33c and a gate electrode 33d form in combination the n-channel enhancement type field effect transistor Qn1, and heavily doped p-type regions 33e and 33f and a gate electrode 33g constitute the p-channel enhancement type field effect transistor Qp1. The first to third inter-level insulating layers 35a to 35c are laminated over these field effect transistors Qn1 and Qp1, and wiring strips 36e to 36h are held in contact through contact holes with the n-type/p-type regions 33b/33c and 33e/33f.

Even though the n-channel/p-channel enhancement type field effect transistors Qn1/Qp1 generate large amount of heat, the bulk region 30b radiates the heat, and does not allow the temperature in the silicon-on-insulator region 30a to rise.

Figure 5A:
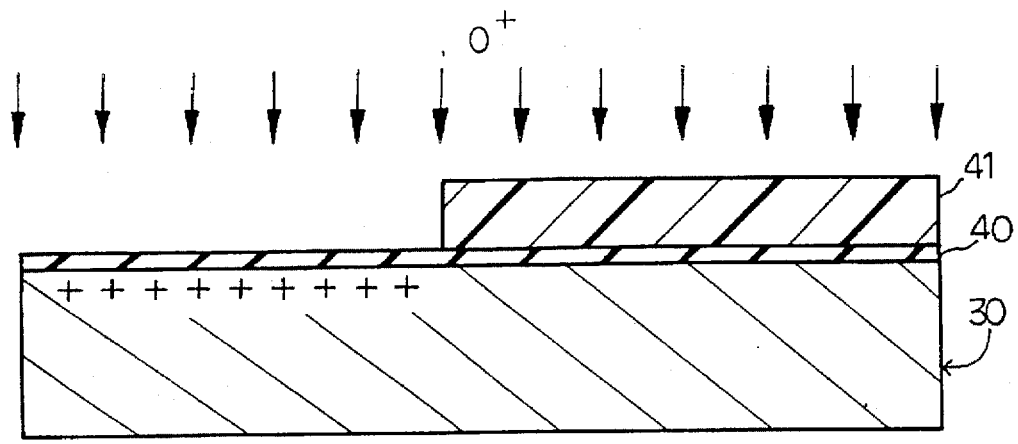
FIGS. 5A to 5H are cross sectional views showing a process sequence for fabricating the semiconductor dynamic random access memory device according to the present invention.

Description is hereinbelow made on a process sequence for fabricating the semiconductor dynamic random access memory device with reference to FIGS. 5A to 5H. The process sequence starts with preparation of the p-type semiconductor substrate 30. A silicon oxide layer 40 is grown on the major surface of the p-type semiconductor substrate 30, and a photo-resist mask 41 covers a part of the silicon oxide layer 40 over the area assigned to the bulk region 30b. Oxygen is ion implanted into the exposed area of the p-type semiconductor substrate 30 at dose of $1 \times 10^{17}$ to $2 \times 10^{18}$ cm$^{-2}$ under acceleration energy of 200 KeV as shown in FIG. 5A.

The photo-resist mask 21 is stripped off, and the p-type semiconductor substrate 30 is heated to 1300 degrees in centigrade for 6 hours. While the p-type semiconductor substrate 30 is being heated, the implanted oxygen reacts with the single crystal silicon, and forms the buried silicon oxide layer 30c. The thickness of the buried silicon oxide layer 30c and, accordingly, the thickness of the p-type surface layer 30d are dependent on the amount of implanted oxygen. If the dose is $10^{18}$ cm$^{-2}$ the p-type surface layer 30d is 150 nanometers thick. The buried silicon oxide layer 30c separates the p-type surface layer 30d from the p-type bottom layer 30e.

However, the p-type surface layer 30d is too thick. The silicon oxide layer 40 is increased in thickness by 200 nanometers by using a thermal oxidation, and the oxidation consumes the p-type surface layer 30d by 100 nanometers thick. In other words, the silicon oxide layer 40 decreases the thickness of the p-type surface layer 30d to 50 nanometers thick. The oxidation of the p-type surface layer 30d is controllable, and the p-type surface layer 30d ranges from 10 nanometers thick to 100 nanometers thick. The silicon oxide layer 40 is uniformly etched in hydrofluoric acid solution by 200 nanometers, and the silicon oxide layer 40 returns to the original thickness.

Figure 5B:
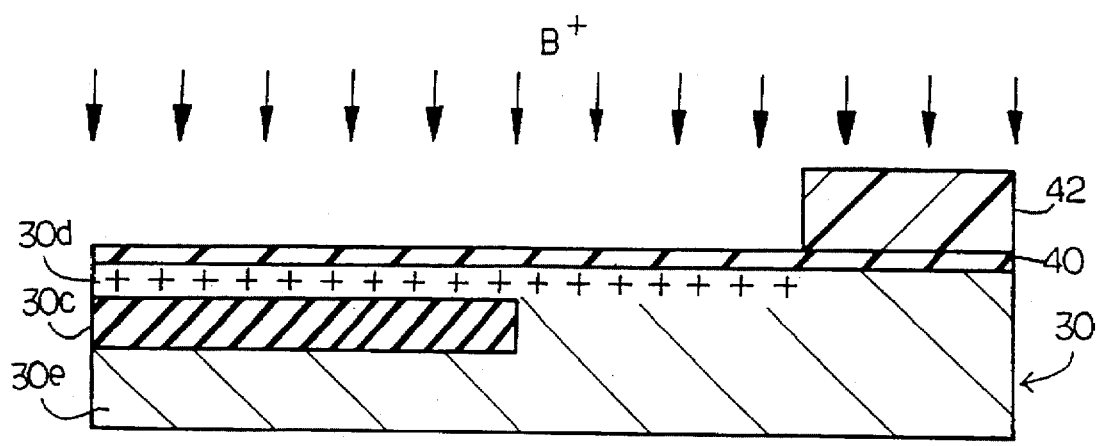

A photo-resist mask 42 is patterned on the silicon oxide layer 40 over an area assigned to the n-type well 30g, and boron is ion implanted into the exposed p-type semiconductor substrate 30 at dose of $1-2 \times 10^{13}$ cm$^{-2}$ under acceleration energy of 70 KeV as shown in FIG. 5B.

Figure 5C:
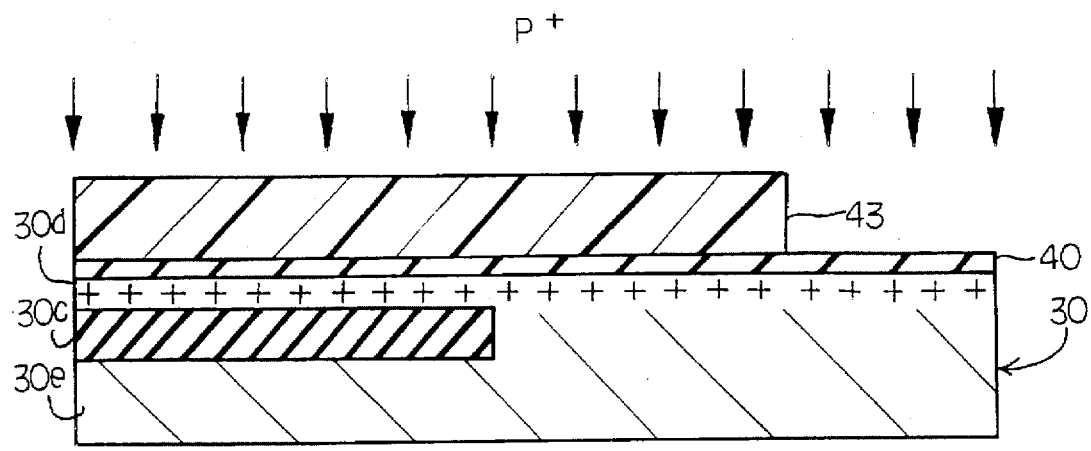

The photo-resist mask 42 is stripped off, and a photo-resist mask 43 is formed over an area assigned to the silicon-on-insulator region 30a and the p-type well 30f, and phosphorous is ion implanted into the exposed area of the p-type semiconductor substrate 30 at dose of $1-2 \times 10^{13}$ cm$^{-2}$ under acceleration energy of 150 KeV as shown in FIG. 5C.

Figure 5D:
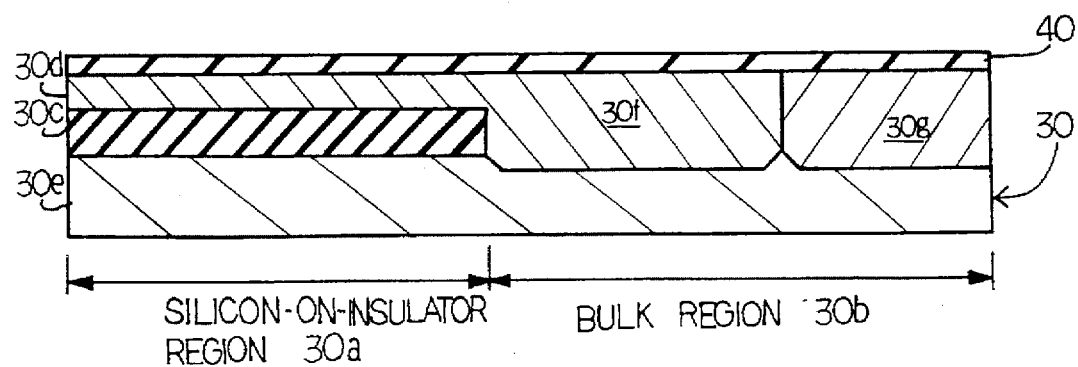

The photo-resist mask 43 is stripped off, and the p-type semiconductor substrate 30 is annealed in gaseous mixture of nitrogen and oxygen at 1200 degrees in centigrade for an hour. The ion-implanted boron and the ion-implanted phosphorous are diffused in the p-type semiconductor substrate 30, and form the p-type well 30f contiguous to the p-type surface layer 30d and the n-type well 30g adjacent to the p-type well 30f as shown in FIG. 5D.

Figure 5E:
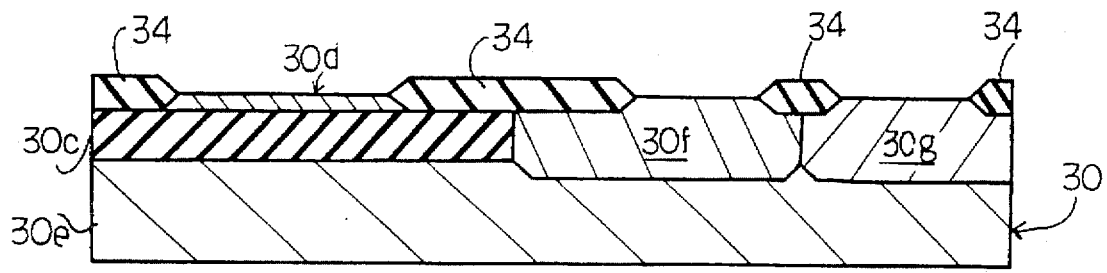

Subsequently, the thick field oxide layer 34 is selectively grown on the p-type surface layer 30d, the p-type well 30f and the n-type well 30g by using the LOCOS process. The thick field oxide layer 34 defines active areas assigned to the two memory cells, the n-channel enhancement type field effect transistor Qn1 and the p-channel enhancement type field effect transistor Qp1. The resultant structure of this stage is illustrated in FIG. 5E.

A silicon oxide layer is thermally grown on the p-type surface layer 30d, the p-type well 30f and the n-type well 30g, and a polysilicon layer is deposited over the entire surface of the structure. An appropriate photo-resist mask is patterned on the polysilicon layer, and the polysilicon layer is patterned into the gate electrodes 31e, 31f, 33d and 33g on the respective gate oxide layers.

An appropriate photo-resist mask is provided over the n-type well 30g, and n-type dopant impurity is ion implanted into the p-type surface layer 30d and the p-type well 30f. As a result, the heavily doped n-type regions 31b to 31d and 33b and 33c are formed in the p-type surface layer 30d and the p-type well 30f in a self-aligned manner with the gate electrodes 31e, 31f and 33d.

Figure 5F:
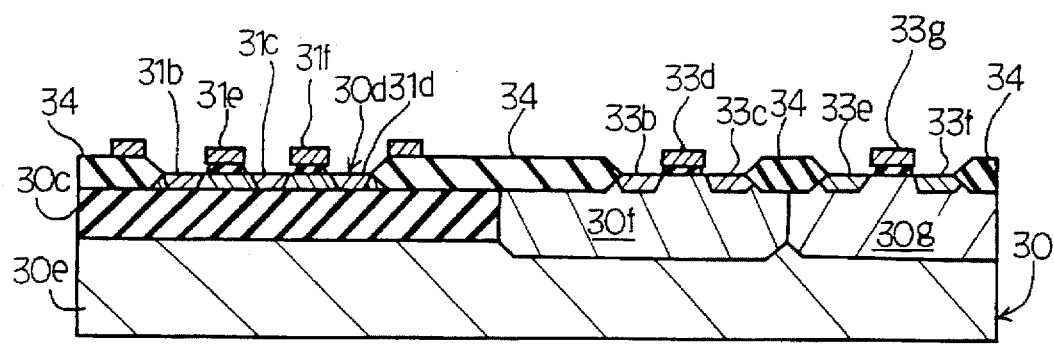

The photo-resist mask is stripped off, and a new photo-resist mask is patterned in such a manner as to cover the p-type surface layer 30d and the p-type well 30f. P-type dopant impurity is ion implanted into the n-type well 30g, and the heavily doped p-type regions 33e and 33f are formed in the n-type well 30g in a self-aligned manner with the gate electrode 33g. The resultant structure of this stage is illustrated in FIG. 5F.

Subsequently, silicon oxide is deposited on the entire surface of the structure by using a chemical vapor deposition, and a phospho-silicate-glass layer or a boro-phospho-silicate-glass layer is laminated on the silicon oxide layer. These layers form in combination the first inter-level insulating layer 35a.

Contact holes are formed in the first inter-level insulating layer 35a, and expose the heavily doped n-type regions 31b and 31d. A tungsten silicide layer is deposited over the first inter-level insulating layer 35a, and is held in contact through the contact holes with the heavily doped n-type regions 31b and 31d. The tungsten silicide layer is patterned though a lithographic process, and the bit lines BL are left on the first inter-level insulating layer 35a.

Subsequently, the bit lines BL and the first inter-level insulating layer 35a are covered with the second inter-level insulating layer 35b, and contact holes are formed through the first and second inter-level insulating layers 35a and 35b. The contact holes expose the heavily doped n-type regions 31b and 31d, respectively.

Figure 5G:
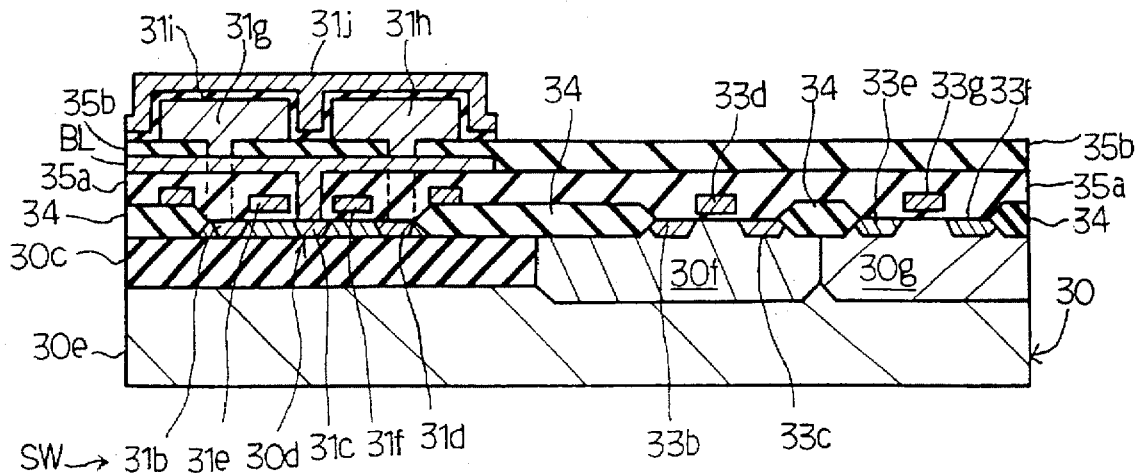

Polysilicon is deposited on the second inter-level insulating layer 35b, and the polysilicon layer is held through the contact holes with the heavily doped n-type regions 31b and 31d. An appropriate photo-resist mask is provided on the polysilicon layer, and the polysilicon layer is patterned into the accumulating electrodes 31g and 31h. Silicon nitride is deposited over the entire surface of the structure, and is partially oxidized so as to laminate a silicon oxide layer on the silicon nitride layer. Polysilicon is deposited on the silicon oxide layer, and the polysilicon layer, the silicon oxide layer and the silicon nitride layer are patterned into the dielectric film structure 31i and the counter electrode 31j as shown in FIG. 5G.

Figure 5H:
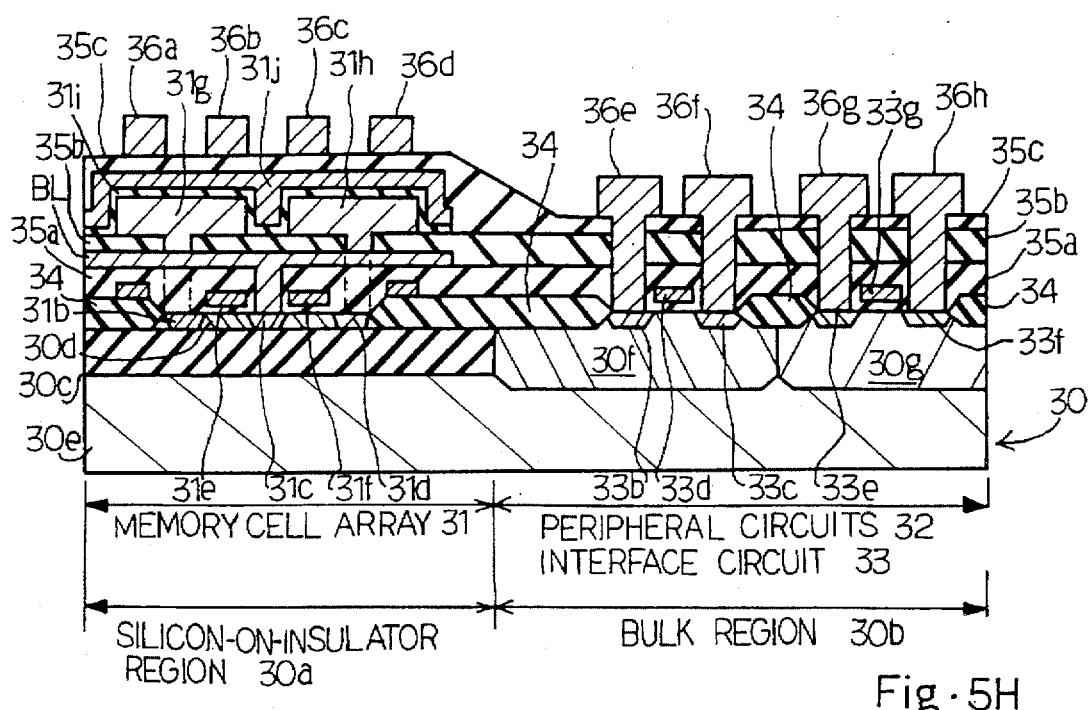

The third inter-level insulating layer 35c is deposited over the entire surface of the structure, and is formed of silicon oxide, phospho-silicate glass or boro-phospho-silicate glass. Contact holes are formed through the first to third inter-level insulating layers 35a to 35c, and aluminum is sputtered on the third inter-level insulating layer 35c. The aluminum layer is patterned into the wirings 36a to 36h by using the lithographic process as shown in FIG. 5H.

As will be understood from the foregoing description, the semiconductor dynamic random access memory device has the memory cell array 31 fabricated on the silicon-on-insulator region 30a, and the p-type surface layer 30d ranges between 10 nanometers to 100 nanometers thick. As a result, the n-channel enhancement type switching transistors SW are improved in sub-threshold characteristics, the short channel effect is restricted, and the stacked type storage capacitors CP are free from the soft error due to alpha particles.

On the other hand, the peripheral circuit 32 and the interface circuit 33 are fabricated on the bulk region 30b, and the bulk region 30b effectively radiates the heat generated by these circuits 32 and 33. As a result, the semiconductor substrate 30 is prevented from temperature rise and malfunctions due to a high temperature environment. Moreover, the heavily doped n-type regions 33b/33c and the heavily doped p-type regions 33e/33f are free from the buried silicon oxide layer 30c, and the manufacturer can form deep p-n junctions for these regions 33b/33c and 33e/33f. If the heavily doped n-type regions 33b/33c and the heavily doped p-type regions 33e/33f have the p-n junctions around 0.1 to 0.15 microns deep, the resistivity is decreased to 100 to 300 ohms/square. The low resistance accelerates the signal propagation without the salicide structure and the lifted structure.

Second Embodiment

Figure 6:
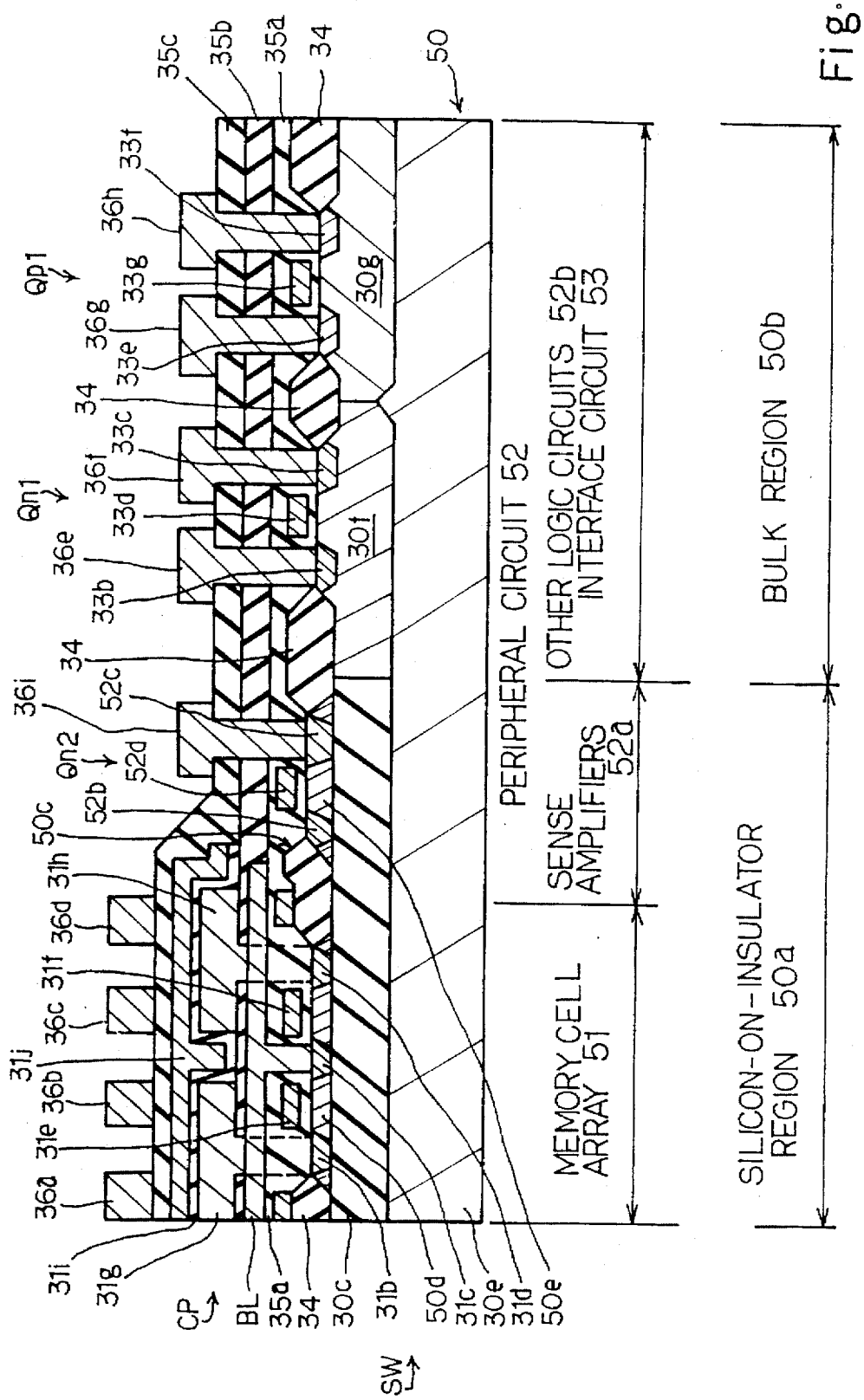
FIG. 6 is a cross sectional view showing the structure of another semiconductor dynamic random access memory device according to the present invention.

Turning to FIG. 6 of the drawings, another semiconductor dynamic random access memory device embodying the present invention is fabricated on a p-type semiconductor substrate 50, and largely comprises a memory cell array 51, a peripheral circuit 52 and an interface circuit 53 as similar to the first embodiment. The p-type semiconductor substrate 50 is divided into a silicon-on-insulator region 50a and a bulk region 50b. The p-type semiconductor substrate 50 is similar to the p-type semiconductor substrate 30 except for a p-type surface layer 50c, and the other layers and wells are labeled with the same references as corresponding layers and wells of the first embodiment without detailed description. The p-type surface layer 50c is formed on the buried silicon oxide layer 30c, and has a thin surface portion 50d and a thick surface portion 50e. In this instance, the thin surface portion 50d ranges 10 nanometers to 100 nanometers thick, and the thick surface portion 50e is 100 to 150 nanometers in thickness.

The memory cell array 51 includes a plurality of memory cells, and the memory cells are fabricated on the thin surface portion 50d in the silicon-on-insulator region 50a. The memory cell is implemented by a series of an n-channel enhancement type switching transistor SW and a stacked type storage capacitor CP as similar to those of the first embodiment, and the regions and the layers forming parts of the memory cells are labeled with the same references as those of the first embodiment without detailed description.

Row address decoder units, column address decoder/selector units, a controller for the row addressing system, a controller for the column addressing system and sense amplifier units 52a are incorporated in the peripheral circuit 52 as similar to the peripheral circuit 32 of the first embodiment. The sense amplifier units 52a are fabricated on the thick surface portion 50e in the silicon-on-insulator region 50a, and one of the component transistors of the sense amplifier units 52a is illustrated in FIG. 6. The component transistor is an n-channel enhancement type field effect transistor Qn2, and heavily doped n-type regions 52b/52c and a gate electrode 52d as a whole constitute the n-channel enhancement type field effect transistor Qn2. A wiring 36i is held in contact through a contact hole formed in the first to third inter-level insulating layers 35a to 35c with the heavily doped n-type region 52c.

The heavily doped n-type regions 52b/52c are deeper than the heavily doped n-type regions 31b/31c/31d of the n-channel enhancement type switching transistors SW.

The other units of the peripheral circuit 52 are fabricated on the bulk region 50b, and serve as other logic circuits 52b.

The interface circuit 53 includes input-and-output circuits fabricated on the bulk region 50b. The layers and the regions of the input-and-output circuit are labeled with the same references as those of the first embodiment without detailed description.

Figure 7A:
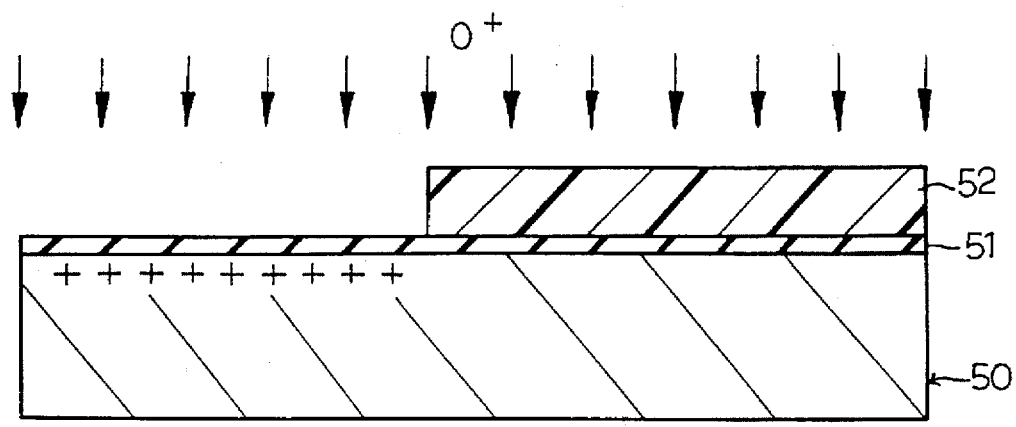
FIGS. 7A to 7D are cross sectional views showing a process sequence for fabricating the semiconductor dynamic random access memory device.

Subsequently, description is made on a process sequence for fabricating the semiconductor dynamic random access memory device implementing the second embodiment. The process sequence starts with preparation of the semiconductor substrate 50. A silicon oxide layer 51 is grown on the major surface of the p-type semiconductor substrate 50, and a photo-resist mask 52 covers a part of the silicon oxide layer 51 over the area assigned to the bulk region 50b. Oxygen is ion implanted into the exposed area of the p-type semiconductor substrate 50 at dose of $1 \times 10^{17}$ to $2 \times 10^{18}$ cm$^{-2}$ under acceleration energy of 200 KeV as shown in FIG. 7A.

The photo-resist mask 52 is stripped off, and the p-type semiconductor substrate 50 is heated to 1300 degrees in centigrade for 6 hours. While the p-type semiconductor substrate 50 is being heated, the implanted oxygen reacts with the single crystal silicon, and forms the buried silicon oxide layer 30c. The thickness of the buried silicon oxide layer 30c and, accordingly, the thickness of the p-type surface layer 50c are dependent on the amount of implanted oxygen If the dose is $10^{18}$ cm$^{-2}$ the p-type surface layer 50c is 150 nanometers thick. The buried silicon oxide layer 30c separates the p-type surface layer 50c from the p-type bottom layer 30e.

Figure 7B:
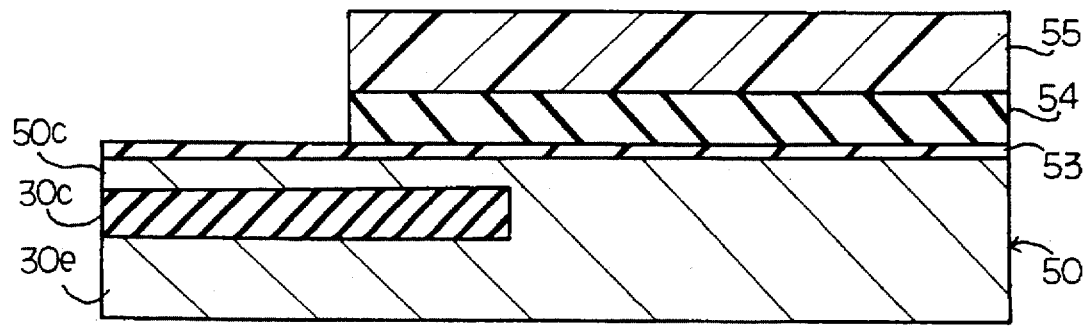

Subsequently, the thin surface portion 50d and the thick surface portion 50e are formed in the p-type surface layer 50c. In this instance, the thin surface portion 50d and the thick surface portion 50e are assumed to be 50 nanometers thick and 120 nanometers thick, respectively. The silicon oxide layer 51 is removed, and a silicon oxide layer 53 is thermally grown to 60 nanometers thick on the entire surface of the p-type semiconductor substrate 50. A silicon nitride layer 54 is deposited to 100 nanometers thick over the silicon oxide layer 53, and a photo-resist mask 55 is provided on the silicon nitride layer 54. The photo-resist mask 55 exposes the silicon nitride layer 54 over the area assigned to the thin surface portion 50d, and the exposed silicon nitride layer 54 is etched away as shown in FIG. 7B.

Figure 7C:
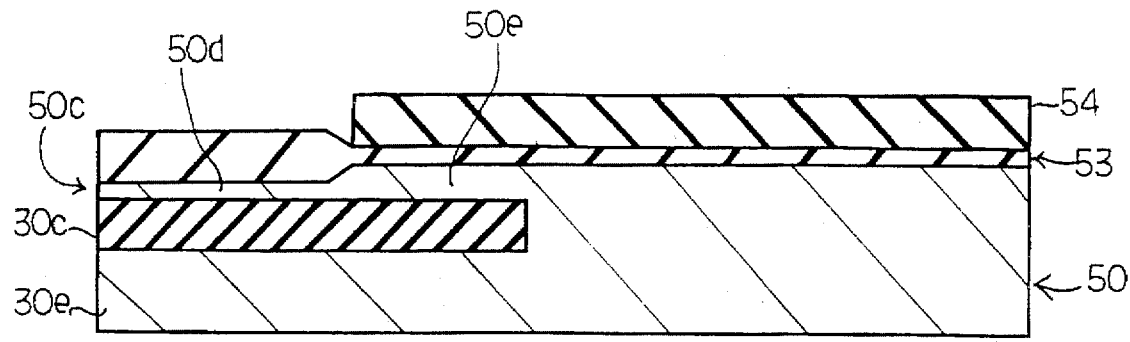

The photo-resist mask 55 is stripped off, and the p-type semiconductor substrate 50 is placed in oxidation atmosphere containing oxygen and hydrogen at 980 degrees in centigrade. The p-type surface layer 50c uncovered with the silicon nitride layer 54 is selectively oxidized, and the silicon oxide layer 53 is partially increased in thickness to 200 nanometers thick as shown in FIG. 7C.

The p-type surface layer 50c is consumed by a half of the thickness of the silicon oxide layer 53. The p-type surface layer 50c is consumed by 30 nanometers thick during the thermal oxidation, and the silicon nitride layer 54 prevents the p-type surface layer 50c therebeneath from the oxygen.

For this reason, the thick surface portion 50e is 120 nanometers thick. On the other hand, the p-type surface layer 50c uncovered with the silicon nitride layer 54 is further oxidized in the oxidation atmosphere, and the thin surface portion 50d is 50 nanometers thick.

Figure 7D:
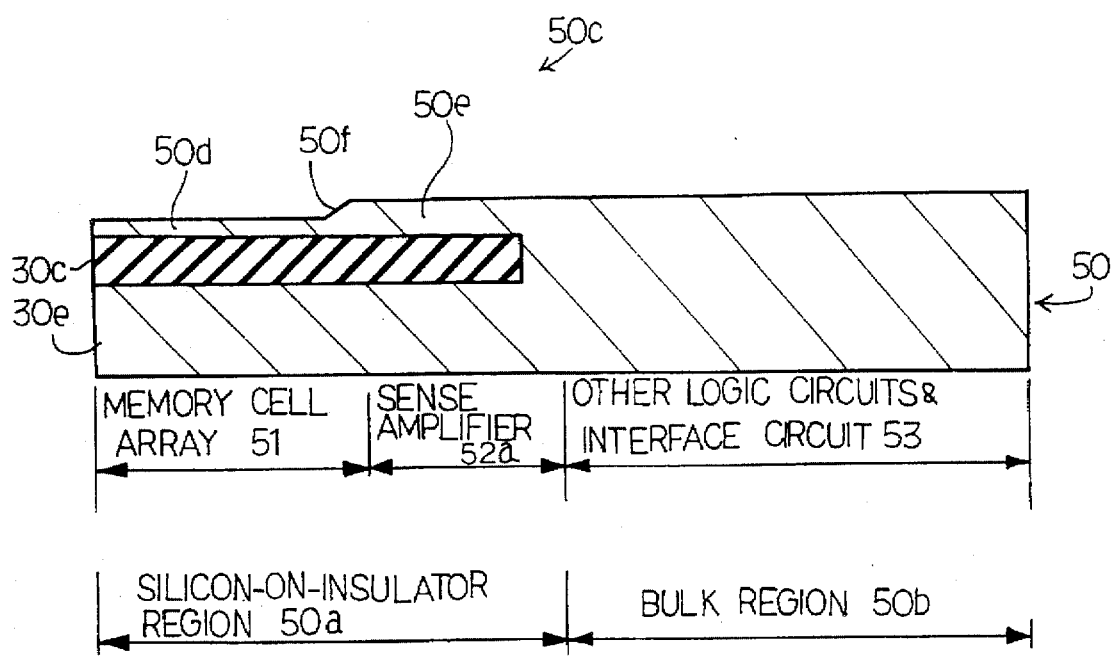

The silicon nitride layer 54 is etched away in phosphoric acid solution (HPO$_3$), and the silicon oxide layer 53 is removed in hydrofluoric acid solution (HF). As a result, a step 50f takes place, and the p-type surface layer 50c is divided into the thin portion 50d and the thick portion 50e as shown in FIG. 7D.

After the formation of the thin and thick surface portions 50d/50e, the process sequence of the second embodiment traces the similar steps to the first embodiment, and no further description is hereinbelow incorporated for the sake of simplicity.

The semiconductor dynamic random access memory device implementing the second embodiment has the memory cell array 51 fabricated on the silicon-on-insulator region 50a and the other logic circuits and the interface circuit 53 fabricated on the bulk region 50b, and this layout achieves all of the advantages of the first embodiment.

In the second embodiment, the sense amplifier units 52a are formed in the thick surface portion 50e of the silicon-on-insulator region 50a. The resistivity of the heavily doped n-type regions 52b/52c ranges between 100 ohms/square and 300 ohms/square, because the thick surface portion 50e allows the manufacturer to form the p-n junction as deep as 0.1 to 0.15 micron. Moreover, the buried silicon oxide layer 30c decreases the parasitic capacitance coupled to the heavily doped n-type regions 52b/52c, and the signal propagation along the bit lines BL is further accelerated by virtue of the reduction of the parasitic capacitance. The small parasitic capacitance increases the magnitude of the potential difference representative of a data bit read out from the memory cell, and improves the noise resistance characteristics.

Although particular embodiments of the present invention have been shown and described, it will be obvious to those skilled in the art that various changes and modifications may be made without departing from the spirit and scope of the present invention. For example, the layout according to the present invention is applicable to another kind of semiconductor memory device, and the substrate may be formed of another semiconductor material. The dynamic random access memory device may form a part of an ultra large scale integration together with other function blocks. In the first and second embodiments, the p-type silicon substrates are used. However, an n-type semiconductor substrate is available, and the process conditions do not limit the technical scope of the present invention.

What is claimed is:

1. A semiconductor memory device fabricated on a semiconductor substrate including a bulk region and a semiconductor-on-insulator region having an insulating layer isolating a first semiconductor layer from a second semiconductor layer, comprising:

a memory cell array fabricated on said first semiconductor layer in said semiconductor-on-insulator region for storing pieces of data information;

an interface circuit fabricated on said bulk region for transferring said pieces of data information to an external device; and a peripheral circuit coupled between said memory cell array and said interface circuit for selectively transferring said pieces of data information therebetween and having first logic circuits fabricated on said bulk region.

2. A semiconductor memory device fabricated on a semiconductor substrate including a bulk region and a semiconductor-on-insulator region having an insulating layer isolating a first semiconductor layer of about 10 nanometers to 100 nanometers thick from a second semiconductor layer, said device comprising:

a memory cell array fabricated on said first semiconductor layer in said semiconductor-on-insulator region for storing pieces of data information;

an interface circuit fabricated on said bulk region for transferring said pieces of data information to an external device; and a peripheral circuit coupled between said memory cell array and said interface circuit for selectively transferring said pieces of data information there between and having first logic circuits fabricated on said bulk region.

3. The semiconductor memory device as set forth in claim 1, in which said memory cell array is formed by a plurality of dynamic random access memory cells.

4. A semiconductor memory device fabricated on a semiconductor substrate including a bulk region and a semiconductor-on-insulator region having an insulating layer isolating a first semiconductor layer from a second semiconductor layer, said device comprising:

a memory cell array fabricated on said first semiconductor layer in said semiconductor-on-insulator region for storing pieces of data information;

an interface circuit fabricated on said bulk region for transferring said pieces of data information to an external device; and a peripheral circuit coupled between said memory cell array and said interface circuit for selectively transferring said pieces of data information therebetween and having address decoders, selectors, controllers for an addressing system and sense amplifiers fabricated on said bulk region.

5. A semiconductor memory device fabricated on a semiconductor substrate including a bulk region and a semiconductor-on-insulator region having an insulating layer isolating a first semiconductor layer from a second semiconductor layer, said first semiconductor layer having a thin portion ranging between about 10 nanometers thick and 100 nanometers thick and a thick portion ranging between about 100 nanometers thick and 150 nanometers thick, said device comprising:

a memory cell array fabricated on said thin portion of said first semiconductor layer in said semiconductor-on-insulator region for storing pieces of data information;

an interface circuit fabricated on said bulk region for transferring said pieces of data information to an external device; and a peripheral circuit coupled between said memory cell array and said interface circuit for selectively transferring said pieces of data information therebetween and having first logic circuits fabricated on said bulk region.

6. The semiconductor memory device as set forth in claim 5, in which said peripheral circuit further has second logic circuits fabricated on said thick portion in said semiconductor-on-insulator region.

7. The semiconductor memory device as set forth in claim 6, in which said first logic circuits include address decoders, selectors and controllers for an addressing system, and said second logic circuits include sense amplifiers.

8. The semiconductor memory device as set forth in claim 6, in which said second logic circuits includes at least one field effect transistor having source and drain regions deeper than source and drain regions of a field effect transistor forming a part of a memory cell incorporated in said memory cell array.

\* \* \* \* \*